(12) United States Patent
Nishio et al.

(10) Patent No.: US 11,383,478 B2
(45) Date of Patent: Jul. 12, 2022

(54) METALLIC LUSTROUS MEMBER WITH ELECTROMAGNETIC WAVE TRANSMISSIBILITY, ARTICLE USING THE MEMBER, AND METAL THIN FILM

(71) Applicant: NITTO DENKO CORPORATION, Ibaraki (JP)

(72) Inventors: Hajime Nishio, Ibaraki (JP); Hironobu Machinaga, Ibaraki (JP); Xiaolei Chen, Ibaraki (JP); Toshihiro Tsurusawa, Ibaraki (JP); Manami Kurose, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 16/344,754

(22) PCT Filed: Oct. 24, 2017

(86) PCT No.: PCT/JP2017/038354
§ 371 (c)(1),
(2) Date: Apr. 24, 2019

(87) PCT Pub. No.: WO2018/079547
PCT Pub. Date: May 3, 2018

(65) Prior Publication Data
US 2019/0275759 A1  Sep. 12, 2019

(30) Foreign Application Priority Data
Oct. 24, 2016 (JP) .............................. JP2016-208000

(51) Int. Cl.
*B32B 3/00* (2006.01)
*B32B 3/14* (2006.01)
(Continued)

(52) U.S. Cl.
CPC .................. *B32B 3/14* (2013.01); *B32B 9/00* (2013.01); *B32B 9/041* (2013.01); *B32B 15/04* (2013.01);
(Continued)

(58) Field of Classification Search
None
See application file for complete search history.

(56) References Cited

U.S. PATENT DOCUMENTS

2007/0098967 A1  5/2007  Ido et al.
2007/0117380 A1*  5/2007  Ido ....................... H01Q 1/3233
438/653

(Continued)

FOREIGN PATENT DOCUMENTS

JP  H8-281857 A  10/1996
JP  H11-268183 A  10/1999
(Continued)

OTHER PUBLICATIONS

The extended European search report issued in corresponding European Patent Application No. 17865289.7 dated Apr. 9, 2020.
(Continued)

*Primary Examiner* — Seth Dumbris
(74) *Attorney, Agent, or Firm* — Hauptman Ham, LLP

(57) ABSTRACT

A metallic lustrous member with electromagnetic wave transmissibility, which is capable of being easily produced even when using not only chromium (Cr) or indium (In) but also any of some other metals such as aluminum (Al), as a material for a metal layer thereof. A metallic lustrous member with electromagnetic wave transmissibility, which is capable of using silver (Ag), zinc (Zn), lead (Pb) or copper (Cu), or an alloy thereof, as a material for a metal layer thereof, in addition to aluminum (Al). The metallic lustrous member with electromagnetic wave transmissibility, com-
(Continued)

prises an indium oxide-containing layer provided along a surface of a substrate, and a metal layer laminated on the indium oxide-containing layer, wherein the metal layer includes, in at least part thereof, a plurality of portions which are in a discontinuous state.

12 Claims, 1 Drawing Sheet

(51) Int. Cl.
    *B32B 9/04*     (2006.01)
    *B32B 15/08*     (2006.01)
    *C23C 14/08*     (2006.01)
    *C23C 28/00*     (2006.01)
    *B32B 9/00*     (2006.01)
    *B32B 15/04*     (2006.01)
    *C23C 14/18*     (2006.01)
    *C23C 14/35*     (2006.01)

(52) U.S. Cl.
    CPC ............ *B32B 15/08* (2013.01); *C23C 14/086* (2013.01); *C23C 28/345* (2013.01); *C23C 14/185* (2013.01); *C23C 14/35* (2013.01); *Y10T 428/24917* (2015.01)

(56) References Cited

U.S. PATENT DOCUMENTS

| | | | |
|---|---|---|---|
| 2008/0081201 A1 | 4/2008 | Kato et al. | |
| 2012/0166023 A1 | 6/2012 | Hara et al. | |
| 2015/0293025 A1 | 10/2015 | Ninomiya et al. | |
| 2016/0201189 A1* | 7/2016 | Palacios-Laloy | ....... C23C 14/08 136/256 |

FOREIGN PATENT DOCUMENTS

| | | |
|---|---|---|
| JP | 2001-329363 A | 11/2001 |
| JP | 2002-212324 A | 7/2002 |
| JP | 2003-004526 A | 1/2003 |
| JP | 2007-093241 A | 4/2007 |
| JP | 2007-144988 A | 6/2007 |
| JP | 2008-080712 A | 4/2008 |
| JP | 2009-298006 A | 12/2009 |
| JP | 2010-005999 A | 1/2010 |
| JP | 2011-162839 A | 8/2011 |
| JP | 2012-225041 A | 11/2012 |
| JP | 2015-182334 A | 10/2015 |
| JP | 2016-134320 A | 7/2016 |
| JP | 2016-144930 A | 8/2016 |
| KR | 10-2011-0138447 A | 12/2011 |
| TW | 201433539 A | 9/2014 |
| WO | 2011/037028 A1 | 3/2011 |
| WO | 2011/090010 A1 | 7/2011 |
| WO | 2014126135 A1 | 8/2014 |
| WO | WO-2015025963 A1 * | 2/2015 ............ G02B 5/208 |
| WO | 2016125823 A1 | 8/2016 |

OTHER PUBLICATIONS

International Search Report for corresponding international application PCT/JP2017/038354 dated Jan. 16, 2018.
Chinese Office Action dated Nov. 20, 2019 for corresponding Chinese Application No. 201780065919.0.
Korean Office Action dated Oct. 1, 2019 for corresponding Korean Application No. 10-2019-7014865.
Korean Office Action dated Oct. 1, 2019 for corresponding Korean Application No. 10-2019-7014909.
Office Action issued for corresponding Japanese Patent Application No. 2018-165238 dated Feb. 1, 2021, along with an English machine translation.
Notification of Reason for Refusal issued for corresponding Korean Patent Application No. 10-2019-7014909 dated Nov. 20, 2020, received on Nov. 27, 2020, along with an English translation.
Office Action dated Dec. 6, 2021 for corresponding Taiwanese Patent Application No. 106136432, along with an English translation.
Office Action dated Mar. 14, 2022 for corresponding Taiwanese Patent Application No. 106136432, along with an English translation.
Communication pursuant to Article 94(3) EPC dated May 23, 2022 for corresponding European Patent Application No. 17 865 289.7.

* cited by examiner

METALLIC LUSTROUS MEMBER WITH ELECTROMAGNETIC WAVE TRANSMISSIBILITY, ARTICLE USING THE MEMBER, AND METAL THIN FILM

CROSS REFERENCE TO RELATED APPLICATION

This application claims the priority of Japanese Patent Application No. 2016-208000, filed on Oct. 24, 2016, in the JPO (Japanese Patent Office). Further, this application is the National Phase Application of International Application No. PCT/JP2017/038354, filed on Oct. 24, 2017, which designates the United States and was published in Japan. Both of the priority documents are hereby incorporated by reference in their entireties.

TECHNICAL FIELD

The present invention relates to a metallic lustrous member with electromagnetic wave transmissibility, an article using the member, and a metal thin film.

BACKGROUND ART

A metallic lustrous member having both lustrousness and electromagnetic wave transmissibility is needed, for example, to decorate a cover member of a millimeter-wave radar mounted to a front component such as a front grille or an emblem at a front end of an automotive vehicle.

The millimeter-wave radar is configured to transmit an electromagnetic wave having a millimeter waveband (frequency: about 77 GHz, wavelength: about 4 mm) forwardly with respect to the vehicle, and receive and analyze a reflected wave from a target so as to measure a distance or a direction with respect to the target, or the size of the target. A result of the measurement can be utilized for inter-vehicle distance measurement, automatic vehicle speed adjustment, automatic brake adjustment, etc. The front component of the vehicle to which the millimeter-wave radar is mounted is a portion constituting, so to say, the face of the vehicle, and having a great impact on a user. Thus, it is preferable to create a high-class appearance by a metallic lustrous front decoration. However, if the front component of the vehicle is made of a metal material, it will substantially preclude or hinder the millimeter-wave radar from emitting and receiving an electromagnetic wave. Therefore, in order to prevent hindering of the function of the millimeter-wave radar without spoiling an aesthetic appearance of the vehicle, there is a need for a metallic lustrous member having both lustrousness and electromagnetic wave transmissibility.

In addition to application to millimeter-wave radars, this type of metallic lustrous member is expected to be applied to various other devices requiring signal transmitting-receiving, e.g., a door handle module of an automotive vehicle using a smart key, in-vehicle communication devices, and electronic devices such as a mobile phone and a personal computer. Further, in recent years, along with development in IoT technologies, the metallic lustrous member is also expected to be applied to a wide range of fields, e.g., home or daily-life appliances such as a refrigerator, in which signal transmitting-receiving has heretofore not been performed.

With regard to the metallic lustrous member, in JP 2007-144988A (Patent Document 1), there is disclosed a resin product comprising a metal coating or film made of chromium (Cr) or indium (In). This resin product comprises: a resin substrate; an inorganic underlying film (inorganic undercoating) containing an inorganic compound and formed on the resin substrate; and the metal film made of chromium (Cr) or indium (In), wherein the metal film is formed on the inorganic underlying film by a physical vapor deposition process to have a lustrous and discontinuous structure. In the Patent Document 1, the inorganic underlying film is composed of (a) a thin film of a metal compound such as: a titanium compound including titanium oxide (TiO, $TiO_2$, $Ti_3O_5$, etc.); a silicon compound including silicon oxide (SiO, $SiO_2$, etc.) or silicon nitride ($Si_3N_4$, etc.); an aluminum compound including aluminum oxide ($Al_2O_3$); an iron compound including iron oxide ($Fe_2O_3$); a selenium compound including selenium oxide (CeO); a zircon compound including zircon oxide (ZrO); or a zinc compound including zinc sulfide (ZnS), or (b) a coating film made of an inorganic coating material, e.g., a coating film made of an inorganic coating material comprising a primary component consisting of silicon, amorphous $TiO_2$ or the like (additionally, any of the metal compounds exemplified above). However, this resin product is based on the assumption of using only chromium (Cr) or indium (In) as a material for the metal film. In other words, a metal superior to chromium and indium in terms of cost and lustrousness, such as aluminum (Al), cannot be used as a material for the metal film.

Further, in JP 2009-298006A (Patent Document 2), there is disclosed a lustrous resin product with electromagnetic wave transmissibility, comprising a metal film which may be formed of not only chromium (Cr) or indium (In) but also aluminum (Al), silver (Ag) or nickel (Ni). In the Patent Document 2, an underlying film having a discontinuous structure is provided, and then the metal film is formed on each of a plurality of discontinuous portions of the underlying film. However, due to restrictions, such as a requirement that an inclination angle of a substrate during sputtering must be set to 0° or 70° to form the underlying film in a discontinuous layer, there is a problem of complexity in production process. Further, in the Patent Document 2, it is impossible to form the metal film, using zinc (Zn), lead (Pb) or copper (Cu), or an alloy thereof.

CITATION LIST

Patent Document

Patent Document 1: JP 2007-144988A
Patent Document 2: JP 2009-298006A
Patent Document 3: JP 2010-5999A

SUMMARY OF INVENTION

Technical Problem

The present invention has been made to solve the above conventional problems, and an object thereof is to provide a metallic lustrous member with electromagnetic wave transmissibility, which is capable of being easily produced, even when using, as a material for a metal layer thereof, not only chromium (Cr) or indium (In) but also any of some other metals such as aluminum (Al). It is another object of the present invention to provide a metallic lustrous member with electromagnetic wave transmissibility, which is capable of using, as a material for a metal layer thereof, zinc (Zn), lead (Pb) or copper (Cu), or an alloy thereof, in addition to aluminum (Al) or silver (Ag).

Solution to Technical Problem

As a result of diligent studies for solving the above problems, the present inventors found that, by using an indium oxide-containing layer as an underlying layer, it becomes possible to form, into a discontinuous structure, a metal layer made of not only chromium (Cr) or indium (In) but also any of some other metals such as aluminum (Al), which normally has difficulty in being formed into a discontinuous structure, and have reached accomplishment of the present invention.

In order to solve the above problems, according to a first aspect of the present invention, there is provided a metallic lustrous member with electromagnetic wave transmissibility, which comprises an indium oxide-containing layer provided along a surface of a substrate, and a metal layer laminated on the indium oxide-containing layer, wherein the metal layer includes, in at least part thereof, a plurality of portions which are in a discontinuous state.

In the metallic lustrous member with electromagnetic wave transmissibility, according to the first aspect of the present invention, by using the indium oxide-containing layer as an underlying layer, it becomes possible to form, into a discontinuous structure, even a metal layer made of a metal such as aluminum (Al) which normally has difficulty in being formed into a discontinuous structure, and thereby a sheet resistance thereof can be increased to improve electromagnetic wave transmissibility. In this way, it becomes possible to provide a metallic lustrous member with electromagnetic wave transmissibility, which is capable of being easily produced, using, as a material for the metal layer, not only chromium (Cr), indium (In) but also any of some other metals such as aluminum (Al). It also becomes possible to provide a metallic lustrous member with electromagnetic wave transmissibility, using, as a material for the metal layer, silver (Ag), zinc (Zn), lead (Pb) or copper (Cu), or an alloy thereof, in addition to aluminum (Al).

Preferably, in the metallic lustrous member with electromagnetic wave transmissibility, according to the first aspect of the present invention, the indium oxide-containing layer is provided in a continuous state. By providing the indium oxide-containing layer in a continuous state, it is possible to improve smoothness and corrosion resistance, and to facilitate forming the indium oxide-containing layer without any in-plane variation.

Here, the substrate may be one selected from the group consisting of a substrate film, a resin molded substrate, a glass substrate, and an article body to be imparted with metallic luster.

In the metallic lustrous member with electromagnetic wave transmissibility, according to the first aspect of the present invention, the indium oxide-containing layer may be made of one selected from the group consisting of indium oxide ($In_2O_3$), indium tin oxide (ITO) and indium zinc oxide (IZO).

Preferably, in the metallic lustrous member with electromagnetic wave transmissibility, according to the first aspect of the present invention, the indium oxide-containing layer has a thickness of 1 nm to 1000 nm. Preferably, in the metallic lustrous member with electromagnetic wave transmissibility, according to the first aspect of the present invention, the metal layer has a thickness of 20 nm to 100 nm. Preferably, in the metallic lustrous member with electromagnetic wave transmissibility, according to the first aspect of the present invention, a ratio of the thickness of the metal layer to the thickness of the indium oxide-containing layer (the thickness of the metal layer/the thickness of the indium oxide-containing layer) is from 0.02 to 100.

Preferably, in the metallic lustrous member with electromagnetic wave transmissibility, according to the first aspect of the present invention, a laminate of the metal layer and the indium oxide-containing layer has a sheet resistance of 100 to 100,000 Ω/□.

In the metallic lustrous member with electromagnetic wave transmissibility, according to the first aspect of the present invention, each of the portions may be formed in an island shape.

In the metallic lustrous member with electromagnetic wave transmissibility, according to the first aspect of the present invention, the metal layer may be made of one selected from the group consisting of aluminum (Al), zinc (Zn), lead (Pb), copper (Cu) and silver (Ag), and alloys thereof.

According to a second aspect of the present invention, there is provided an article which uses the substrate film, the resin molded substrate or the glass substrate, or an article in which the member is provided on the article body to be imparted with metallic luster.

According to a third aspect of the present invention, there is provided a metal thin film which is provided along a surface of a substrate, wherein the metal thin film has a thickness of 20 nm to 100 nm, and includes, in at least part thereof, a plurality of island-shaped portions which are in a discontinuous state.

The metal thin film may be formed in a transferable manner. In this case, the metal thin film can be easily provided on any of various article bodies.

Effect of Invention

The present invention can provide a metallic lustrous member with electromagnetic wave transmissibility, which is capable of being easily produced, even when using, as a material for a metal layer thereof, not only chromium (Cr) or indium (In) but also any of some other metals such as aluminum (Al). The present invention can also provide a metallic lustrous member with electromagnetic wave transmissibility, which is capable of using, as a material for a metal layer thereof, silver (Ag), zinc (Zn), lead (Pb) or copper (Cu), or an alloy thereof, in addition to aluminum (Al).

DESCRIPTION OF EMBODIMENTS

With reference to the accompanying drawings, a preferred embodiment of the present invention will now be described. Although only the preferred embodiment of the present invention will be shown in the following for the sake of convenience of explanation, it should be understood that the present invention is not limited thereto.

1. Basic Configuration

Figure 1:
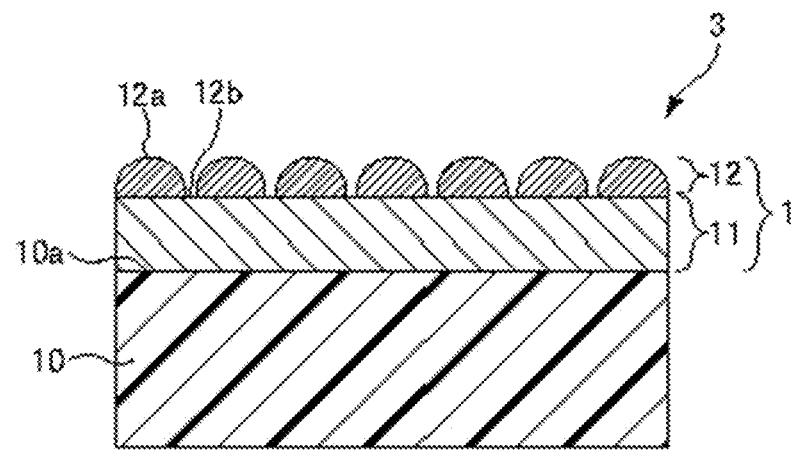
FIG. 1(a) is a schematic sectional view of a metallic lustrous member with electromagnetic wave transmissibility according to one embodiment of the present invention, and an electromagnetic wave-transmissive metal film using the metallic lustrous member.
FIG. 1(b) is an electron microscope photograph of a surface of the metallic lustrous member with electromagnetic wave transmissibility according to this embodiment.
Figure 1:
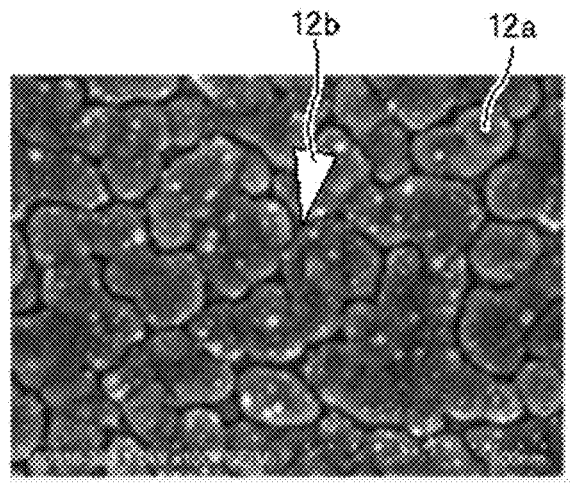

FIG. 1(a) is a schematic sectional view depicting a metallic lustrous member with electromagnetic wave transmissibility (hereinafter referred to as "metallic lustrous member") 1 according to one embodiment of the present invention, and an electromagnetic wave-transmissive metal film (hereinafter referred to as "metal film") 3 using the metallic lustrous member, and FIG. 1(b) is an electron microscope photograph (SEM image) presenting a surface of the metallic lustrous member 1 according to this embodiment. Here, an image size of the electron microscope photograph is 1.16 μm×0.85 μm.

The metallic lustrous member 1 comprises an indium oxide-containing layer 11 containing at least indium oxide and serving as an underlying layer, and a metal layer 12 laminated on the indium oxide-containing layer 11. The metal film 3 comprises the metallic lustrous member 1, and a substrate film 10. The indium oxide-containing layer 11 is provided on a surface of the substrate film 10 to be imparted with metallic luster.

The indium oxide-containing layer 11 may be provided directly on the surface of the substrate film 10, or may be provided indirectly on the surface of the substrate film 10 through a protective film or the like provided on the surface of the substrate film 10. Preferably, the indium oxide-containing layer 11 is provided on the surface of the substrate film 10 to be imparted with metallic luster, in a continuous state, i.e., without any gap therebetween. By providing the indium oxide-containing layer 11 in a continuous state, it is possible to improve smoothness and corrosion resistance of the indium oxide-containing layer 11 and thus improve smoothness and corrosion resistance of the metallic lustrous member 1 and the metal film 3, and to facilitate forming the indium oxide-containing layer 11 without any in-plane variation.

The metal layer 12 is laminated on the indium oxide-containing layer 11. The metal layer 12 includes a plurality of portions 12a. In a state in which the metal layer 12 is laminated on the indium oxide-containing layer 11, in at least part of the metal layer 12, the portions 12a are in a discontinuous state, i.e., in at least part of the metal layer 12, the portions 12a are separated from each other by a gap 12b. Because the portions 12a are separated from each other by the gap 12b, a sheet resistance in the portions 12a is increased, so that an interaction of the portions 12a with the electromagnetic wave is weakened to allow electromagnetic waves to be transmitted through the metal layer 12. Each of the portions 12a is an aggregate of sputtered particles formed by subjecting a metal to vapor deposition, sputtering or the like. When the sputtered particles form a thin film on a substrate such as the substrate film 10, surface diffusibility of the particles on the substrate exerts an influence on the shape of the thin film. As a result of diligent researches, the present inventors have succeeded in allowing the metal layer to grow in a discontinuous state by providing the indium oxide-containing layer on the substrate to promote the surface diffusibility of the metal layer. Here, as used in this specification, the term "discontinuous state" means a state in which the portions 12a are separated from each other by the gap 12b, and therefore electrically insulated from each other. As a result of the electrical insulation, the sheet resistance is increased, so that it becomes possible to obtain a desirable electromagnetic wave transmissibility. The configuration of the discontinuity is not particularly limited. For example, it may include an island-shaped configuration and a cracked configuration. Here, the term "island shape" means a structure in which the particles as the aggregate of the sputtered particles are independent of each other, and laid on the indium oxide-containing layer 11 in slightly spaced-apart relation to each other or in partially contact relation with each other, as presented in FIG. 1(b).

2. Substrate Film (Substrate)

As the substrate film 10, it is possible to use a transparent film made of a homopolymer or copolymer of polyethylene terephthalate (PET), polyethylene naphthalate (PEN), polybutylene terephthalate, polyamide, polyvinyl chloride, polycarbonate (PC), cycloolefin polymer (COP), polystyrene, polypropylene (PP), polyethylene, polycycloolefin, polyurethane, polymethylmethacrylate (PMMA), or ABS. Such a transparent film has no influence on lustrousness and electromagnetic wave transmissibility. However, from a viewpoint of subsequently forming the indium oxide-containing layer 11 and the metal layer 12 thereon, it is desirable that the transparent film is capable of withstanding high temperatures during vapor deposition, sputtering or the like. Thus, among the above materials, e.g., polyethylene terephthalate, polyethylene naphthalate, polymethylmethacrylate, polycarbonate, cycloolefin polymer, ABS, polypropylene, and polyurethane are preferable. Among them, polyethylene terephthalate, cycloolefin polymer, polycarbonate and polymethylmethacrylate are particularly preferable, because they have a good balance between heat resistance and cost. The substrate film 10 may be a single-layer film or may be a laminate film. From a viewpoint of processability and the like, the thickness thereof is preferably from about 6 to 250 μm. With a view to enhancing adhesion with the indium oxide-containing layer 11, it may be subjected to plasma treatment or easy-adhesion treatment.

It should be noted here that the substrate film 10 is merely one example of an object on which the metallic lustrous member 1 according to the present invention can be provided (this object will hereinafter be referred to as "substrate"). In addition to the substrate film 10, the substrate includes a resin molded substrate, a glass substrate, and an article body to be imparted with metallic luster. Examples of the resin molded substrate include a resin substrate for an emblem of an automotive vehicle. Examples of the article body to be imparted with metallic luster includes a body of a door knob of an automotive vehicle using a smart key, and a housing (outer casing) of a mobile phone, a personal computer, a refrigerator or the like. The metallic lustrous member 1 according to the present invention can be provided on any of the above substrates. In this case, the substrate to be provided with the metallic lustrous member 1 preferably has the similar material to that of or satisfies the similar requirements to those of the above substrate film 10.

3. Indium Oxide-Containing Layer

As a material for the indium oxide-containing layer 11, it is possible to use indium oxide ($In_2O_3$) itself, or a metal-containing substance such as indium tin oxide (ITO) or indium zinc oxide (IZO). Among them, ITO and IZO containing the second metal are more preferable in that they have high discharge stability in a sputtering process. By using the indium oxide-containing layer 11, it becomes possible to form a continuous film along the surface of the substrate. In this case, it also becomes possible to laminate the metal layer on the indium oxide-containing layer, in e.g., an island-shaped discontinuous structure. Further, in this case, as a material for the metal layer, it becomes possible to use not only chromium (Cr) or indium (In) but also any of some other metals such as aluminum, which have been hardly used as the material because they normally have difficulty in being formed into a discontinuous structure, as described in more detail later. The content rate by weight of tin (Sn) to $In_2O_3$ in ITO is not particularly limited. For example, it may be from 2.5 wt % to 30 wt %, preferably from 3 wt % to 10 wt %. Further, for example, the content rate by weight of zinc oxide (ZnO) to $In_2O_3$ in IZO is may be from 2 wt % to 20 wt %. From a viewpoint of sheet resistance, electromagnetic wave transmissibility and productivity, the thickness of the indium oxide-containing layer 11 is generally preferably 1000 nm or less, more preferably 50 nm or less, still more preferably 20 nm or less. On the other hand, from a viewpoint of laminating the metal layer 12 in a discontinuous state, the thickness of the indium oxide-containing layer 11 is preferably 1 nm or more, and, from a viewpoint of reliably obtaining the discontinuous state, it is more preferably 2 nm or more.

4. Metal Layer

The metal layer 12 is essentially capable of bringing out sufficient lustrousness. Further, it is desirable that the melting point thereof is relatively low. This is because the metal layer 12 is created through thin-film growth using sputtering. For this reason, a metal having a melting point of about 1000° C. or less is suitable as a material for the metal layer 12. For example, the metal layer 12 is preferably made of at least one metal selected from the group consisting of aluminum (Al), zinc (Zn), lead (Pb), copper (Cu) and silver (Ag), or any alloy comprising a primary component consisting of two or more of these metals. Particularly, Al and Al alloys are preferable for reason of lustrousness, stability, cost, etc., of a material.

With a view to allowing the metal layer 12 to bring out sufficient lustrousness, the thickness of the metal layer 12 is generally preferably 20 nm or more. On the other hand, from a viewpoint of sheet resistance and electromagnetic wave transmissibility, the thickness of the metal layer 12 is generally preferably 100 nm or less. Thus, for example, the thickness of the metal layer 12 is preferably from 20 nm to 100 nm, more preferably from 30 nm to 70 nm. This thickness range is suited to forming a uniform film with good productivity, and can provide good appearance of a resin molded article as a final product.

Further, for the similar reasons, the ratio of the thickness of the metal layer to the thickness of the indium oxide-containing layer (the thickness of the metal layer/the thickness of the indium oxide-containing layer) is preferably from 0.1 to 100, preferably from 0.3 to 35.

Further, it is preferable that a laminate of the metal layer and the indium oxide-containing layer has a sheet resistance of 100 to 100,000Ω/□. In this case, the electromagnetic wave transmissibility of the laminate at a wavelength of 1 GHz is from about 10 to 0.01 [−dB]. More preferably, the sheet resistance is from 1,000 to 50,000Ω/□. The value of the sheet resistance is largely influenced by not only the material and thickness of the metal layer but also the material and thickness of the indium oxide-containing layer serving as an underlying layer. Therefore, the value of the sheet resistance needs to be set while taking into account the relationship with the indium oxide-containing layer.

5. Mechanism Causing Metal Layer to Become Discontinuous State

If the metal layer 12 is formed directly on the substrate without providing the indium oxide-containing layer 11, the metal layer 12 is formed on the substrate 10 in a continuous state. In this case, although sufficient lustrousness can be obtained, the sheet resistance becomes significantly small, so that it is impossible to ensure the electromagnetic wave transmissibility. Differently, in the case where the metal layer 12 is laminated on the indium oxide-containing layer 11 formed on the substrate, the metal layer 12 is formed, in a discontinuous state, e.g., on the indium oxide-containing layer 11 formed in a continuous state, so that it is of course possible to obtain sufficient lustrousness and also possible to ensure the electromagnetic wave transmissibility. Although details of a mechanism causing the metal layer 12 to become a discontinuous state on the indium oxide-containing layer 11 is not exactly clear, it is inferred as follows. That is, in a thin film forming process for the metal layer 12, easiness in forming a discontinuous structure of the metal layer 12 is relevant to surface diffusibility of the metal layer 11 on a to-be-coated member (in this embodiment, the indium oxide-containing layer 11) to be coated with the metal layer 12. Specifically, the discontinuous structure is more likely to be formed under the condition that: the temperature of the to-be-coated member is higher; the wettability of the metal layer with respect to the to-be-coated member is smaller; and the melting point of the metal layer is lower. Therefore, in regard to some metals other than aluminum (Al) used particularly in the following Examples, such as zinc (Zn), lead (Pb), copper (Cu) and silver (Ag) each having a relatively low melting point, the discontinuous structure is considered to be able to be formed in the similar manner.

6. Production of Metallic Lustrous Member

One example of a production method for the metallic lustrous member 1 will be described by taking an example in which the substrate film 10 is used as the substrate, i.e., the metal film 3 is produced. Although not particularly described, a metallic lustrous member using the substrate other than the substrate film 10 can also be produced by the similar method.

(1) Step of Forming Indium Oxide-Containing Layer

The indium oxide-containing layer 11 is formed onto the substrate film 10. The indium oxide-containing layer 11 can be formed by vacuum deposition, sputtering, ion plating or the like. Among them, sputtering is preferable, from a viewpoint of being capable of strictly controlling the thickness of the indium oxide-containing layer 11 even when it has a relatively large area.

(2) Step of Laminating Metal Layer

Subsequently, the metal layer 12 is laminated to the indium oxide-containing layer 11. In this case, for example, sputtering can be used. Preferably, the metal layer 12 is laminated such that it comes into direct contact with the indium oxide-containing layer 11 without interposing any additional layer therebetween. However, as long as the above mechanism based on surface diffusibility of the metal layer 12 on the indium oxide-containing layer 11 effectively functions, an additional layer may be interposed therebetween.

7. Examples

The present invention will be more specifically described below by taking inventive examples and comparative examples. Various samples of the metal film 3 were prepared, and evaluated in terms of sheet resistance, electromagnetic wave transmission attenuation amount, and visible light reflectance. The sheet resistance and the electromagnetic wave transmission attenuation amount are evaluation indexes of the electromagnetic wave transmissibility, and the visible light reflectance is an evaluation index of the lustrousness. A larger value of each of the visible light reflectance and the sheet resistance is more desirable, and a smaller value of the electromagnetic wave transmission attenuation amount is more desirable.

Details of evaluation methods are as follows.

(1) Sheet Resistance

The sheet resistance was measured by an eddy-current measurement method in accordance with JIS-Z2316, using a non-contact type resistance measuring device NC-80MAP manufactured by Napson Corporation.

This sheet resistance needs to be equal to or greater than 100Ω/□, preferably equal to or greater than 200Ω/□, more preferably equal to or greater than 600Ω/□. If the sheet resistance is less than 100Ω/□, there is a problem that a sufficient electromagnetic wave transmissibility cannot be obtained.

(2) Electromagnetic Wave Transmission Attenuation Amount

An electromagnetic wave transmission attenuation amount at 1 GHz was evaluated using a KEC method measurement and evaluation jig, and a spectral analyzer CXA signal Analyzer NA9000A manufactured by Agilent technologies Inc. An electromagnetic wave transmissibility in a frequency band (76 to 80 GHz) of a millimeter-wave radar is correlated with an electromagnetic wave transmissibility in a microwave band (1 GHz), and thus they exhibit relatively close values. Thus, in this evaluation, the electromagnetic wave transmissibility, i.e., microwave electric field transmission attenuation amount, in the microwave microwave band (1 GHz), was used as an index.

This microwave electric field transmission attenuation amount needs to be equal to or less than 10 [−dB], preferably, equal to or less than 5 [−dB], more preferably equal to or less than 2 [−dB]. If the electromagnetic wave transmission attenuation amount is equal to or greater than 10 [−dB], there is a problem that 90% or more of an electromagnetic wave is shielded.

(3) Visible Light Reflectance

A reflectance at a measurement wavelength of 550 nm was measured using a spectrophotometer U4100 manufactured by Hitachi High Technologies Co., Ltd. As a reference value, the reflectance of an Al-deposited mirror was defined as a reflectance of 100%.

In order to have a sufficient lustrousness, the visible light reflectance need to be equal to or greater than 20%, preferably equal to or greater than 40%, more preferably equal to or greater than 50%. If the visible light reflectance is less than 20%, there is a problem that the lustrousness significantly deteriorates, resulting in failing to ensure excellent external appearance.

A result of the evaluations is presented in the following Table 1.

TABLE 1

| | Metal Layer | | Underlying Layer | | Sheet Resistance [Ω/□] | Electromagnetic Wave Transmission Attenuation Amount @ 1 GHz [−dB] | Evaluation | Visible Light Reflectance @ 550n [%] | Evaluation | Comprehensive Evaluation |
|---|---|---|---|---|---|---|---|---|---|---|
| | Material | Thickness | Material | Thickness | | | | | | |
| Inventive Example 1 | Al | 50 nm | ITO(Sn + In$_2$O$_3$) Sn10% | 50 nm | 260 | 4.5 | ○ | 56 | ◎ | ○ |
| Inventive Example 2 | Al | 30 nm | ITO(Sn + In$_2$O$_3$) Sn10% | 50 nm | 257 | 4.5 | ○ | 38 | △ | △ |
| Inventive Example 3 | Al | 40 nm | ITO(Sn + In$_2$O$_3$) Sn10% | 50 nm | 258 | 4.5 | ○ | 48 | ○ | ○ |
| Inventive Example 4 | Al | 65 nm | ITO(Sn + In$_2$O$_3$) Sn10% | 50 nm | 250 | 4.6 | ○ | 71 | ◎ | ○ |
| Inventive Example 5 | Al | 50 nm | ITO(Sn + In$_2$O$_3$) Sn10% | 30 nm | 613 | 2.1 | ○ | 55 | ◎ | ○ |
| Inventive Example 6 | Al | 50 nm | ITO(Sn + In$_2$O$_3$) Sn10% | 20 nm | 1303 | 1.1 | ◎ | 56 | ◎ | ◎ |
| Inventive Example 7 | Al | 50 nm | ITO(Sn + In$_2$O$_3$) Sn10% | 10 nm | 2450 | 0.3 | ◎ | 56 | ◎ | ◎ |
| Inventive Example 8 | Al | 50 nm | ITO(Sn + In$_2$O$_3$) Sn10% | 5 nm | 4830 | 0.02 | ◎ | 55 | ◎ | ◎ |
| Inventive Example 9 | Al | 50 nm | ITO(Sn + In$_2$O$_3$) Sn30% | 50 nm | 320 | 3.8 | ○ | 56 | ◎ | ○ |
| Inventive Example 10 | Al | 50 nm | ITO(Sn + In$_2$O$_3$) Sn7.5% | 50 nm | 300 | 4.0 | ○ | 56 | ◎ | ○ |
| Inventive Example 11 | Al | 50 nm | ITO(Sn + In$_2$O$_3$) Sn2.5% | 50 nm | 245 | 4.8 | ○ | 56 | ◎ | ○ |
| Inventive Example 12 | Al | 40 nm | In$_2$O$_3$ | 50 nm | 170 | 6.0 | △ | 47 | ○ | △ |
| Inventive Example 13 | Al | 50 nm | IZO(In$_2$O$_3$ + ZnO) | 50 nm | 92 | 9.6 | △ | 55 | ◎ | △ |
| Comparative Example 1 | Al | 110 nm | ITO(Sn + In$_2$O$_3$) Sn10% | 50 nm | 0.6 | 45.1 | X | 78 | ◎ | X |
| Comparative Example 2 | Al | 50 nm | None | — | 2.2 | 36.8 | X | 73 | ◎ | X |

Inventive Example 1

A PET film (thickness: 125 μm) manufactured by Mitsubishi Plastics, Inc. was used as a substrate film First of all, using DC magnetron sputtering, a 50 nm-thick ITO layer was formed directly on a surface of the substrate film to extend along a surface of the substrate film. The temperature of the substrate film during formation of the ITO layer was set at 130° C. The ITO is a composition obtained by adding Sn to $In_2O_3$ in an amount of 10 wt %.

Subsequently, using AC sputtering (AC: 40 kHz), a 50 nm-thick aluminum (Al) layer was formed on the ITO layer to obtain a metallic lustrous member (metal film). The temperature of the substrate film during formation of the Al layer was set at 130° C.

Figure 2:
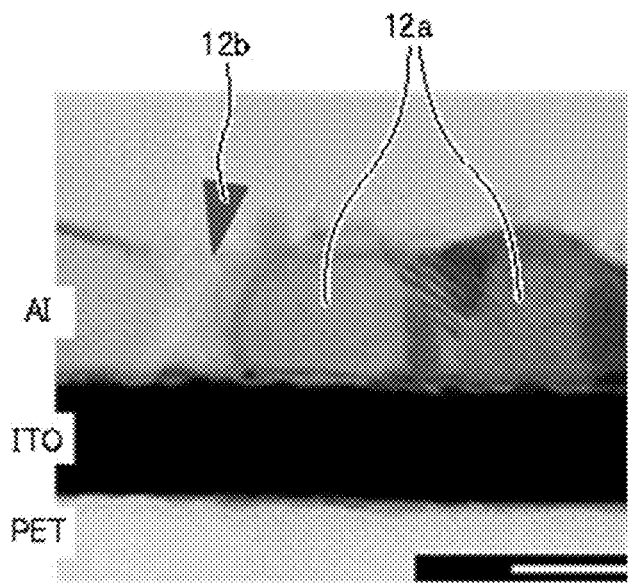
FIG. 2 is an image of a cut surface in a partial region of FIG. 1(b).

FIG. 1(b) is an electron microscope photograph (SEM image) of a surface of the metallic lustrous member (metal film) obtained as a result of the above process, and FIG. 2 is an image of a cut surface in a partial region of FIG. 1(b). Here, an image size of the electron microscope photograph in FIG. 2 is 1.16 μm×0.85 μm.

In Inventive Example 1, as is evident from these figures, the ITO layer of the metallic lustrous member is provided along the surface of the substrate film in a continuous state, so that high smoothness and corrosion resistance could be obtained, and, on the other hand, the aluminum layer laminated on the ITO layer includes a plurality of portions 12a formed in a discontinuous state, so that the sheet resistance was 260Ω/□, and the electromagnetic wave transmission attenuation amount at a wavelength of 1 GHz was 4.5 [–dB], i.e., in terms of the electromagnetic wave transmissibility, a good result could be obtained. In Table 1, with regard to a result of "evaluation" of the electromagnetic wave transmission attenuation amount, when the electromagnetic wave transmission attenuation amount is less than 2 [–dB], the electromagnetic wave transmissibility was evaluated as "⊚", and, when the electromagnetic wave transmission attenuation amount is from 2 [–dB] to less than 5 [–dB], the electromagnetic wave transmissibility was evaluated as "○". Further, when the electromagnetic wave transmission attenuation amount is from 5 [–dB] to less than 10 [–dB], the electromagnetic wave transmissibility was evaluated as "Δ", and, when the electromagnetic wave transmission attenuation amount is 10 [–dB] or more, the electromagnetic wave transmissibility was evaluated as "X".

Further, the visible light reflectance of the metallic lustrous member was 56%, i.e., in terms of the visible light reflectance, a good result could be obtained. For the sake of simplicity, in Table 1, with regard to a result of "evaluation" of the visible light reflectance, when the visible light reflectance is greater than 50%, the lustrousness was evaluated as "⊚", and, when the visible light reflectance is from 50% to greater than 40%, the lustrousness was evaluated as "○". Further, when the visible light reflectance is from 40% to greater than 20%, the lustrousness was evaluated as "Δ", and, when the visible light reflectance is 20% or less, the lustrousness was evaluated as "X". Further, with respect to "comprehensive evaluation" of the electromagnetic wave transmissibility and the lustrousness, when the two properties have the same evaluation, the same evaluation is indicated in the field, and, when the evaluation of one of the properties is worse than that of the other property, the worse evaluation is indicated in the field. As a result, in Inventive Example 1, the comprehensive evaluation was "○", i.e., a good metallic lustrous member or metal film having both the electromagnetic wave transmissibility and the lustrousness could be obtained.

Inventive Examples 2 to 4

In Inventive Examples 2 and 3, the thickness of the aluminum layer laminated on the ITO layer was changed to a smaller value than that in Inventive Example 1. On the other hand, in Inventive Example 4, the thickness was changed to a larger value than that in Inventive Example 1. The remaining conditions were the same as those in Inventive Example 1.

As a result of the measurements, with respect to the sheet resistance and the electromagnetic wave transmission attenuation amount, similar values and evaluations to those in Inventive Example 1 could be obtained in each of Inventive Examples 2 to 4. On the other hand, with respect to the visible light reflectance, in each of Inventive Examples 2 and 3 in which the thickness of the aluminum layer is smaller than that in Inventive Example 1, a value was slightly inferior to that in Inventive Example 1, whereas, in Inventive Example 4, a better value than that in Inventive Example 1 could be obtained. However, even in Inventive Examples 2 and 3, it is possible to ensure sufficient practicality.

Inventive Examples 5 to 8

The thickness of the ITO layer was changed to a smaller value than that in Inventive Example 1. The remaining conditions were the same as those in Inventive Example 1.

As a result of the measurements, with respect to the sheet resistance and the electromagnetic wave transmission attenuation amount, better values than those in Inventive Example 1 could be obtained in each of Inventive Examples 5 to 8. Further, with respect to the visible light reflectance, a similar value and evaluation to those in Inventive Example 1 could be obtained in each of Inventive Examples 5 to 8. From these Inventive Examples, it has become apparent that the thickness of the ITO layer may be reduced, i.e., that a material cost can be reduced by reducing the thickness of the ITO layer.

Inventive Examples 9 to 12

In Inventive Example 9, the content rate of Sn in the ITO layer was changed to a larger value than that in Inventive Example 1. On the other hand, in Inventive Examples 10 to 12, the content rate was changed to a smaller value than that in Inventive Example 1. Here, in Inventive Example 12, the content rate of Sn in the ITO layer is set to zero. Thus, to be exact, this layer is not an ITO layer but an indium oxide ($In_2O_3$) layer. Further, in Inventive Example 12, the thickness of the aluminum layer was set to 40 nm. The remaining conditions were the same as those in Inventive Example 1.

As a result of the measurements, with respect to the sheet resistance and the electromagnetic wave transmission attenuation amount, similar values to those in Inventive Example 1 could be obtained in each of Inventive Examples 9 to 11, and values in Inventive Example 12 were slightly inferior to those in Inventive Example 1. On the other hand, with respect to the visible light reflectance, in each of Inventive Examples 9 to 11, a similar value and evaluation to those in Inventive Example 1 could be obtained, whereas a value in Inventive Example 12 was slightly inferior to that in Inventive Example 1. From these results, it has become apparent that the ITO layer preferable contains Sn.

Inventive Example 13

As a material for the indium oxide-containing layer, IZO obtained by adding ZnO to indium oxide was used, instead of ITO. ZnO is added to In₂O₃ in an amount of 11 wt %. The remaining conditions were the same as those in Inventive Example 1.

As a result of the measurements, with respect to the sheet resistance and the electromagnetic wave transmission attenuation amount, values in Inventive Example 13 were slightly inferior to those in Inventive Example 1. On the other hand, with respect to the visible light reflectance, a similar value and evaluation to those in Inventive Example 1 could be obtained. It has become apparent that, even using IZO to which ZnO is added, sufficient practicality can be ensured, although the comprehensive example in Inventive Example 13 is inferior to that in Inventive Example 1.

Comparative Example 1

The thickness of the aluminum layer laminated on the ITO layer was changed to a larger value than that in Inventive Example 1. The remaining conditions were the same as those in Inventive Example 1.

As a result of the measurements, with respect to the visible light reflectance, due to the increase in thickness, a better value than that in Inventive Example 1 could be obtained. On the other hand, with respect to the sheet resistance and the electromagnetic wave transmission attenuation amount, values in Comparative Example 1 were significantly inferior to those in Inventive Example 1, and evaluated as impractical.

Comparative Example 2

The aluminum layer was formed directly on the substrate film without providing any ITO layer. The remaining conditions were the same as those in Inventive Example 1.

As a result of the measurements, with respect to the visible light reflectance, a similar value and evaluation to those in Inventive Example 1 could be obtained. On the other hand, with respect to the sheet resistance and the electromagnetic wave transmission attenuation amount, values in Comparative Example 2 were significantly inferior to those in Inventive Example 1, and evaluated as impractical.

8. Utilization of Metal Thin Film

The metal layer 12 formed in the metallic lustrous member 1 has a small thickness of about 20 to 100 nm, and can be used by itself as a metal thin film. For example, the metal layer 12 may be formed on the indium oxide-containing layer 11 laminated on a substrate such as the substrate film 10 by sputtering to obtain a film. Further, separately from this, an adhesive is applied onto a substrate to produce an adhesive layer-attached substrate. Then, the film is laminated to the adhesive layer-attached substrate, such that the metal layer 12 comes in contact with the adhesive layer. In this way, the metal layer (metal thin film) 12 which has been located on the outermost surface side of the film can be transferred to the outermost surface side of the adhesive layer-attached substrate, by separating the film and the substrate from each other, after fully having contacted them.

It is to be understood that the present invention is not limited to the above embodiment and the examples, but various changes and modifications may be made therein without departing from the spirit and scope thereof as set forth in appended claims.

INDUSTRIAL APPLICABILITY

The metal film or the metallic lustrous member according to the present invention can be suitably used, e.g., to decorate a cover member of a millimeter-wave radar mounted to a front component such as a front grille or an emblem at a front end of an automotive vehicle. Further, the present invention may also be applied to various other articles requiring both an aesthetic quality and electromagnetic wave transmissibility, such as a mobile phone, a smart phone, a tablet PC, a notebook PC, and a refrigerator.

LIST OF REFERENCE SIGNS

1: metallic lustrous member
3: metal film
10: substrate film
11: indium oxide-containing layer
12: metal layer

The invention claimed is:

1. A metallic lustrous member with electromagnetic wave transmissibility, comprising:
   a substrate;
   a continuous indium oxide-containing layer on a surface of the substrate; and
   a metal layer consisting of aluminum (Al) and optionally one of the following: zinc (Zn), lead (Pb), copper (Cu) or silver (Ag) and alloys thereof, formed by sputtering on the continuous indium oxide-containing layer,
   wherein
   the metal layer is formed having a plurality of portions which are in a discontinuous state on the continuous indium oxide-containing layer.

2. The member as recited in claim 1, wherein the indium oxide-containing layer is made of one selected from the group consisting of indium oxide (In₂O₃), indium tin oxide (ITO) and indium zinc oxide (IZO).

3. The member as recited in claim 1, wherein the indium oxide-containing layer has a thickness of 1 nm to 1000 nm.

4. The member as recited in claim 1, wherein the metal layer has a thickness of 20 nm to 100 nm.

5. The member as recited in claim 1, wherein a ratio of the thickness of the metal layer to the thickness of the indium oxide-containing layer (the thickness of the metal layer/the thickness of the indium oxide-containing layer) is from 0.02 to 100.

6. The member as recited in claim 1, wherein a laminate of the metal layer and the indium oxide-containing layer has a sheet resistance of 100 to 100,000Ω/□.

7. The member as recited in claim 1, wherein each of the portions is formed in an island shape.

8. The member as recited in claim 1, wherein the substrate is one selected from the group consisting of a substrate film, a resin molded substrate, a glass substrate, and an article body to be imparted with metallic luster.

9. An article which uses the substrate film, the resin molded substrate or the glass substrate, as recited in claim 8.

10. A metal thin film provided along a surface of a substrate, wherein
   the substrate comprises a base portion and a continuous indium oxide-containing layer on the base portion,
   the metal thin film is formed by sputtering on the continuous indium oxide-containing layer,
   the metal thin film has a thickness of 20 nm to 100 nm, and
   the metal thin film is formed having a plurality of island-shaped portions which are in a discontinuous state on the continuous indium oxide-containing layer, and
   the metal thin film consists of aluminum (Al) and optionally one of the following: zinc (Zn), lead (Pb), copper (Cu) or silver (Ag) and alloys thereof.

11. An article in which the metallic lustrous member as recited in claim 1 is provided on a body of the article.

12. The member as recited in claim 1, wherein the indium oxide-containing layer is provided on the surface of the substrate by sputtering.

* * * * *